United States Patent
Köllmann et al.

(10) Patent No.: US 12,461,146 B2
(45) Date of Patent: Nov. 4, 2025

(54) ANALOG PHASE SELECTION TEST SYSTEM

(71) Applicant: NXP B.V., Eindhoven (NL)

(72) Inventors: Andreas Johannes Köllmann, Rosengarten (DE); Ulrich Moehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 412 days.

(21) Appl. No.: 17/943,288

(22) Filed: Sep. 13, 2022

(65) Prior Publication Data

US 2024/0085476 A1 Mar. 14, 2024

(51) Int. Cl.
*G01R 31/317* (2006.01)
*G01R 25/00* (2006.01)
*G01R 31/319* (2006.01)
*G01R 31/3193* (2006.01)
*H03K 5/156* (2006.01)
*H03K 5/19* (2006.01)

(52) U.S. Cl.
CPC . *G01R 31/31727* (2013.01); *G01R 31/31922* (2013.01); *G01R 25/00* (2013.01); *G01R 25/005* (2013.01); *G01R 31/31937* (2013.01); *H03K 5/1565* (2013.01); *H03K 5/19* (2013.01)

(58) Field of Classification Search
CPC ........ G01R 31/31727; G01R 31/31922; G01R 25/00; G01R 25/005; G01R 31/31937; H03K 5/1565; H03K 5/19
See application file for complete search history.

(56) References Cited

U.S. PATENT DOCUMENTS

| | | | |
|---|---|---|---|
| 6,194,916 B1 * | 2/2001 | Nishimura | G01R 25/005 331/25 |
| 7,363,178 B2 | 4/2008 | Boerstler et al. | |
| 7,904,264 B2 | 3/2011 | Boerstler et al. | |

(Continued)

FOREIGN PATENT DOCUMENTS

WO 2020210359 A1 10/2020

OTHER PUBLICATIONS

Markoni et al., "Implementation XOR Logic Gate for Phase Difference Detector in Automatic Synchronizer for Synchronous Generator" 2021 International Conference on Technology and Policy in Energy and Electric Power (ICT-PEP) (Year: 2021).*

(Continued)

*Primary Examiner* — John C Kuan

(57) ABSTRACT

A system includes a phase-shift to duty-cycle converter and a low pass filter. The phase-shift to duty-cycle converter has a first input for a reference clock and a second input for a phase-shifted clock that is phase-shifted relative to the reference clock. The low pass filter has an input coupled to an output of the phase-shift to duty-cycle converter and an output for an output signal. In some implementations, the phase-shift to duty-cycle converter includes a simple logic gate and a reset-set flip flop. The simple logic gate has a third input coupled to the first input and a fourth input coupled to the second input, and the reset-set flip flop has a fifth input coupled to the first input and a sixth input coupled to the second input. The low pass filter is coupled to the output of one of the simple logic gate and the reset-set flip flop.

17 Claims, 13 Drawing Sheets

(56) References Cited

U.S. PATENT DOCUMENTS

| | | | | |
|---|---|---|---|---|
| 2014/0145768 | A1* | 5/2014 | Mathur | H03L 7/0898 |
| | | | | 327/157 |
| 2016/0126961 | A1* | 5/2016 | Chen | H03K 5/1565 |
| | | | | 327/156 |
| 2022/0197330 | A1* | 6/2022 | Xavier | H03L 7/0818 |
| 2022/0381822 | A1* | 12/2022 | Schubert | H03K 5/06 |

OTHER PUBLICATIONS

Mitra et al., "An FPGA-Based Phase Measurement System" IEEE Transactions on Very Large Scale Integration (VLSI) Systems, vol. 26, No. 1, Jan. 2018 (Year: 2018).*

U.S. Appl. No. 17/661,944 "Radar System", filed May 4, 2022.

* cited by examiner

ANALOG PHASE SELECTION TEST SYSTEM

BACKGROUND

Phase shifting between different circuits can be used to align processing or sampling clocks. For example in a radar sensor system, the analog-to-digital converters of leader and follower integrated circuits sample their respective analog input signals at the same point in time. As another example, sensitive analog circuits use separate clock edges between digital clock events to reduce interference or crosstalk effects. In many implementations, a phase-shifted clock generator such as a delay line, delay locked loop, or frequency divider is used to generate a plurality of phase-shifted clocks based on a reference clock. A phase selector circuit receives the plurality of phase-shifted clocks and outputs a desired phase-shifted clock. A phase selection test system is used to ensure that the phase selection circuit outputs the desired phase-shifted clock.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The phase selection test systems disclosed herein enable the phase difference between high frequency clock signals to be measured on-chip using ADCs, switches, analog test buses, and the like without extra-wide bandwidths and without requiring the high frequency clock signals to be driven off-chip to be measured by external, independent components. The disclosed phase-selection test systems include a phase-shift to duty-cycle converter and a low pass filter. The phase-shift to duty-cycle converter receives a reference clock signal and a phase-shifted clock signal and generates an output signal with a duty cycle indicative of the phase difference between the reference and phase-shifted clock signals. The low pass filter averages the duty cycle of the output signal from the phase-shift to duty-cycle converter, which converts the output signal into a low frequency signal such the ADCs, switches, analog test buses, and the like need not be modified to have extra-wide bandwidths.

Figure 1:
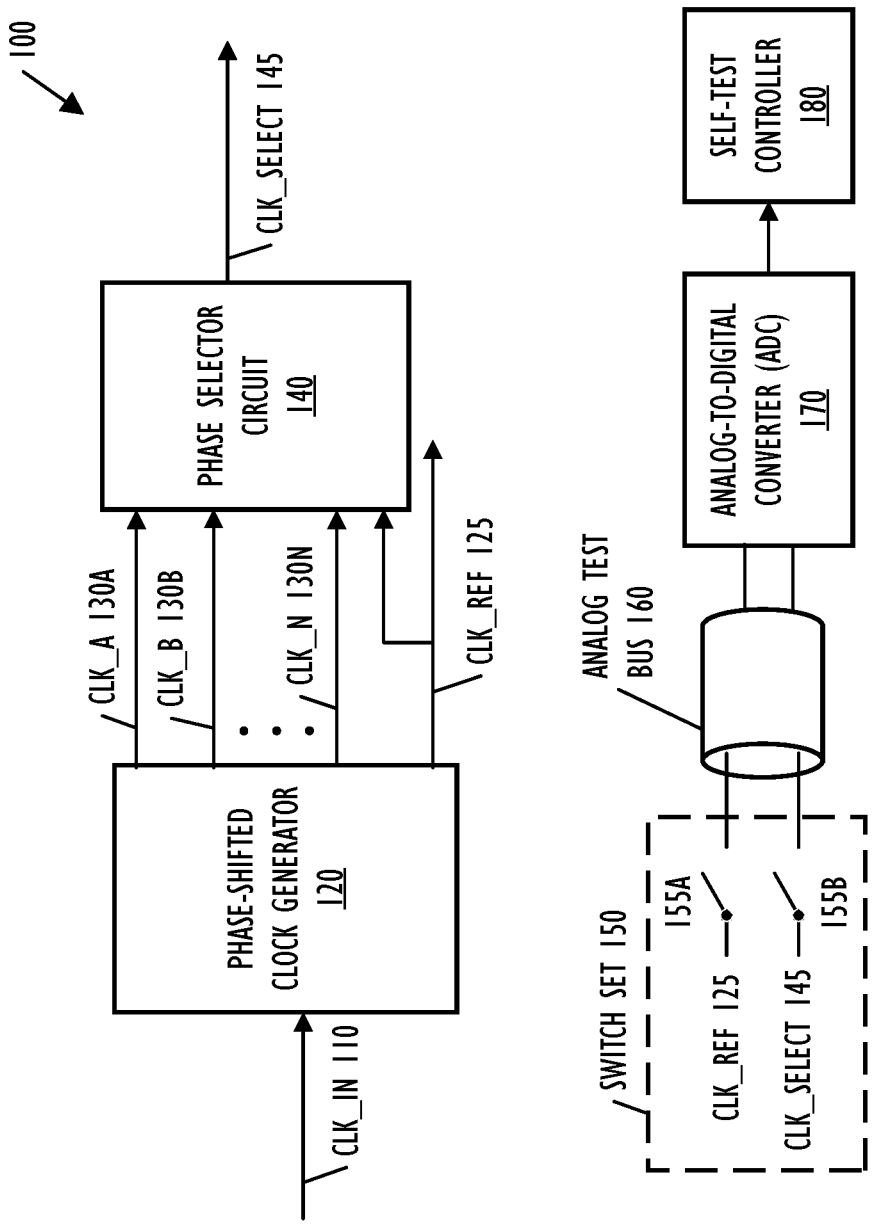
FIG. 1 shows, in block diagram form, an example phase-shifted clock generation and selection system with a mixed signal test circuit, according to an embodiment of the invention.

FIG. 1 shows, in block diagram form, an example phase-shifted clock generation and selection system 100 with a mixed signal test circuit, according to an embodiment of the invention. The phase-shifted clock generation and selection system 100 includes a phase-shifted clock generator 120, a phase selector circuit 140, a switch set 150, an analog test bus 160, and an analog-to-digital converter (ADC) 170 for built-in self-test purposes. The switch set 150 includes switches 155A-B. The components of the phase-shifted clock generation and selection system 100 with a mixed signal test circuit may be included on a single integrated circuit. The phase-shifted clock generator 120 receives an input clock CLK_IN 110 and generates a reference clock CLK_REF 125 and a number N of phase-shifted clock signals CLK_A 130A through CLK_N 130N. The phase-shifted clock generator 120 can be any appropriate phase-shifted clock generator, such as a frequency divider, a delay line, a delay-locked loop, and the like.

In some implementations including a frequency divider phase-shifted clock generator 120, the reference clock CLK_REF 125 is an unshifted copy of the input clock CLK_IN 110. The plurality of phase-shifted clock signals CLK_A 130A through CLK_N 130N are divisions of the input clock CLK_IN 110 that have a different frequency and are phase shifted relative to the input clock CLK_IN 110. For example, the phase-shifted clock signal CLK_A 130A has a phase that is shifted 30 degrees (°) relative to the phase of the input clock CLK_IN 110 and a frequency approximately half the frequency of the input clock CLK_IN 110, and the phase-shifted clock signal CLK_B 130B has a phase that is shifted 60° relative to the phase of the input clock CLK_IN 110 and a frequency approximately one fourth the frequency of the input clock CLK_IN 110. In other implementations, CLK_A 130A and CLK_B 130B may be phase-shifted relative to CLK_IN 110 by increments other than 30° and other frequency divisions of CLK_IN 110.

In some implementations including a delay line or a delay-locked loop phase-shifted clock generator 120, the reference clock CLK_REF 125 is an unshifted copy of the input clock CLK_IN 110. The plurality of phase-shifted clock signals CLK_A 130A through CLK_N 130N are copies of the input clock CLK_IN 110 that have the same frequency but are phase shifted relative to the input clock CLK_IN 110. For example, the phase-shifted clock signal CLK_A 130A has a phase that is shifted 30 degrees (°) relative to the phase of the input clock CLK_IN 110, and the phase-shifted clock signal CLK_B 130B has a phase that is shifted 60° relative to the phase of the input clock CLK_IN 110. In other implementations, CLK_A 130A and CLK_B 130B may be phase-shifted relative to CLK_IN 110 by increments other than 30°.

Figure 2:
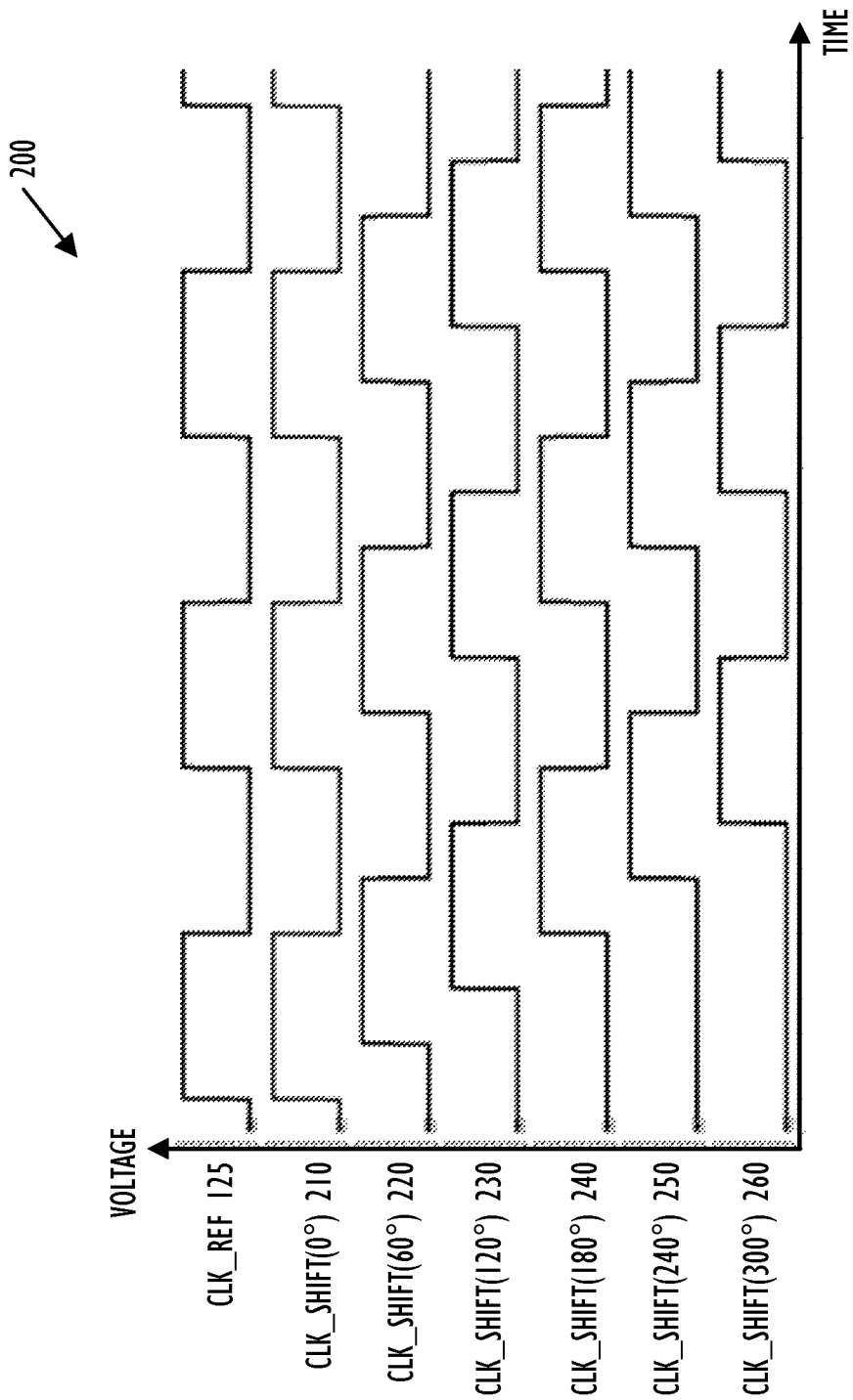
FIG. 2 shows a diagram of a reference clock and phase-shifted clocks generated by the example phase-shifted clock generation and selection system shown in FIG. 1.

The reference clock signal CLK_REF 125 and the plurality of phase-shifted clock signals CLK_A 130A through CLK_N 130N are described further herein with respect to FIG. 2, which shows a diagram 200 of an example reference clock CLK_REF 125 and an example plurality of phase-shifted clocks 210-260 generated by the example phase-shifted clock generation and selection system 100 shown in FIG. 1. In this example, the phase-shifted clock generator 120 includes a delay line or a delay-locked loop and generates six phase-shifted clocks: CLK_SHIFT(0°) 210 that has a 0° phase shift relative to the reference clock CLK_REF 125; CLK_SHIFT(60°) 220 that has a 60° phase shift relative to the reference clock CLK_REF 125; CLK_SHIFT(120°) 230 that has a 120° phase shift relative to the reference clock CLK_REF 125; CLK_SHIFT(180°) 240 that has a 180° phase shift relative to the reference clock CLK_REF 125; CLK_SHIFT(240°) 250 that has a 240° phase shift relative to the reference clock CLK_REF 125; and CLK_SHIFT(300°) 260 that has a 300° phase shift relative to the reference clock CLK_REF 125.

In the example diagram 200 and for ease of illustration throughout, CLK_REF 125 and CLK_SHIFT 210-260 have a duty cycle of approximately 50%, although in other implementations, the reference and phase-shifted clock signals may have a different duty cycle or different duty cycles from each other. Returning to the phase-shifted clock generation and selection system 100 shown in FIG. 1, the reference clock CLK_REF 125 and the plurality of phase-shifted clocks CLK_A 130A through CLK_N 130N are provided to the phase selector circuit 140, which outputs a particular phase-shifted clock CLK_SELECT 145. The reference clock CLK_REF 125 and the selected clock CLK_SELECT 145 can be provided to other circuits, such as ADCs in leader and follower integrated circuits (ICs).

To ensure the phase selector circuit 140 is outputting the clock with the desired phase shift relative to the reference clock CLK_REF 125, CLK_SELECT 145 and CLK_REF 125 are also provided to switch 155A and switch 155B, respectively, in switch set 150, which are used to alternately deliver CLK_SELECT 145 and CLK_REF 125 to the analog test bus 160. The analog test bus 160 is coupled to the built-in self-test ADC 170. The ADC 170 samples the analog clock signals CLK_REF 125 and CLK_SELECT 145 and provides the digital clock signals to a self-test controller 180, for comparison to ensure the phase selector circuit 140 is outputting the clock signal with the desired phase shift relative to the reference clock. The self-test control 180 can be any appropriate digital logic circuit, such as one or more central processing units, digital signal processors, application specific integrated circuits, microcontrollers and the like.

However, the sampling rate of the ADC 170 and the bandwidths of the switches 155A-B and the analog test bus 160 may be relatively small, for example in the lower megahertz (MHz) range, such that only low frequency or DC signals can be measured using the on-chip switch set 150, analog test bus 160, and ADC 170. That is, the sampling rate of the ADC 170 and the bandwidths of the switches 155A-B and the analog test bus 160 may be too small to accommodate the high frequency clock signals CLK_REF 125 and CLK_SELECT 145. For example, the clock signals CLK_REF 125 and CLK_SELECT 145 can be in the gigahertz (GHz) range, while the bandwidth of the analog test bus 160 can be in the range of 100 kilohertz (kHz) to a few MHz, too small to accommodate the high frequency clock signals. To confirm proper selection of phase-shifted high frequency clock signals, such as in the GHz range, the high frequency clock signals are driven off-chip and measured by external, independent components. However, transmission lines carrying the high frequency signals off-chip can create interference and disrupt operation of other circuits on the integrated circuit. In addition, the independent measurement components for the high frequency signals greatly increases the manufacturing cost and may be impractical for mass production.

Figure 3:
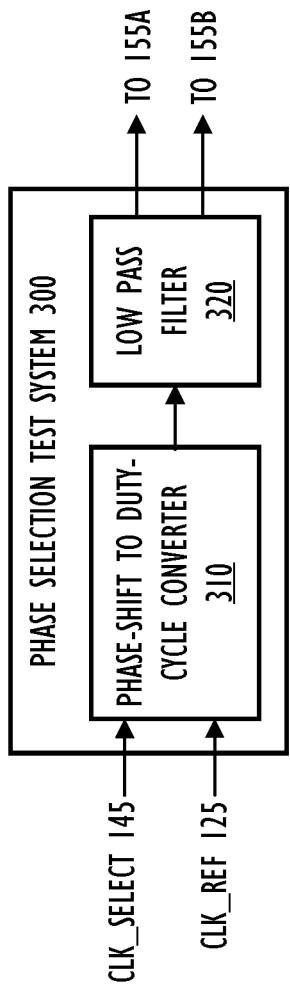
FIG. 3 shows, in block diagram form, an example analog test circuit for the example phase-shifted clock generation and selection system shown in FIG. 1, according to an embodiment of the invention.

To accommodate the narrow bandwidths of the switch set 150 and the analog test bus 160 as well as the sampling rate of the ADC 170, some phase selection test systems generate signals with a duty cycle based on the phase shift between CLK_REF 125 and CLK_SELECT 145. FIG. 3 shows, in block diagram form, an example analog test circuit 300 for the example phase-shifted clock generation and selection system shown in FIG. 1, according to an embodiment of the invention. For ease of explanation, the example analog test circuit 300 is described herein with reference to components of the phase-shifted clock generation and selection system 100 shown in FIG. 1. The phase selection test system 300 includes a phase-shift to duty-cycle converter 310 and a low pass filter 320.

The phase-shift to duty-cycle converter 310 receives the reference clock signal CLK_REF 125 and the selected, phase-shifted clock signal CLK_SELECT 145, and generates an output signal having a duty cycle dependent on the phase difference between CLK_REF 125 and CLK_SELECT 145. The low pass filter 320 receives the output of the phase-shift to duty-cycle converter 310 and averages the duty cycle of the output signal. The DC output of the low pass filter 320 can be provided to switches 155A-B in the switch set 150, the analog test bus 160, and the ADC 170 to ensure the phase selector circuit 140 outputs the clock signal with the desired phase shift relative to the reference clock.

Figure 4:
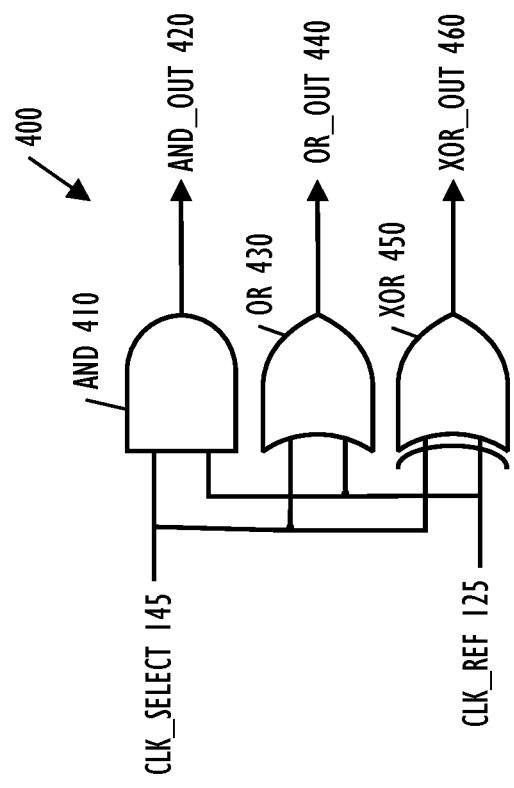
FIG. 4 shows a diagram of three example simple logic implementations of the phase-shift to duty-cycle converter in the example analog test circuit shown in FIG. 3, according to an embodiment of the invention.

The phase-shift to duty-cycle converter 310 can be implemented by a simple logic gate, a reset-set (RS) flip flop, or both. FIG. 4 shows a diagram 400 of three example simple logic implementations that may be used in place of the phase-shift to duty-cycle converter 310 in the example analog test circuit 300 shown in FIG. 3, according to an embodiment of the invention. The diagram 400 includes three possible implementations: an AND gate 410, an OR gate 430, and an exclusive OR (XOR) gate 450. Although the possible implementations shown in diagram 400 include only the AND gate 410, the OR gate 430, and the XOR gate 450, in other implementations other simple logic gates such as a NOT AND gate, a NOT OR gate, or a NOT XOR gate can be used.

Figure 5:
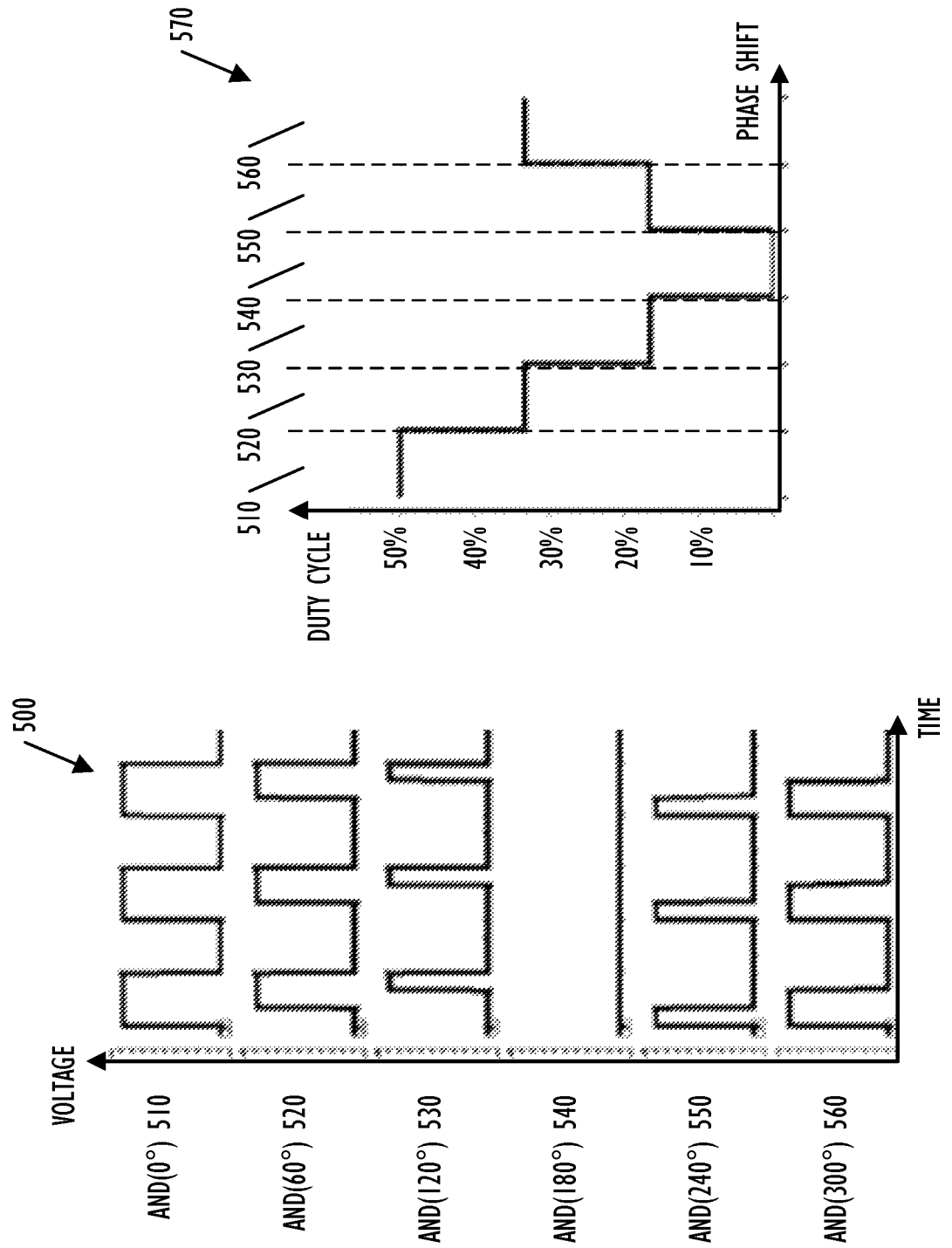
FIG. 5 shows diagrams of the output and corresponding duty cycle of the AND gate in the example simple logic phase-shift to duty-cycle converter shown in FIG. 4 for each of the phase-shifted clock signals shown in FIG. 2 and the corresponding duty cycles, according to an embodiment of the invention.

The AND gate 410 has a first input that receives the reference clock signal CLK_REF 125 and a second input that receives the selected, phase-shifted clock signal CLK_SELECT 145. The AND gate 410 outputs the signal AND_OUT 420, which is logic high in response to both CLK_REF 125 and CLK_SELECT 145 being logic high and logic low in response to either of CLK_REF 125 and CLK_SELECT 145 being logic low. Thus, the output signal AND_OUT 420 has a duty cycle that is dependent on the phase shift between the reference clock signal CLK_REF 125 and the selected, phase-shifted clock signal CLK_SELECT 145 and is discussed further herein with respect diagrams 500 and 570 shown in FIG. 5.

Diagram 500 shows the resulting AND outputs between the reference clock signal CLK_REF 125 and the phase-shifted clock signals CLK_SHIFT 210-260 shown in FIG. 2 over time. Diagram 570 shows the duty cycle of the AND_OUT 420 across phase shifts. In diagram 500, the output AND(0°) 510 shows the output of logical AND 410 between CLK_REF 125 and CLK_SHIFT(0°) 210, which has a 0° phase shift relative to the reference clock CLK_REF 125. The resulting duty cycle shown in diagram 570 is approximately 50%. In diagram 500, the output AND(60°) 520 shows the output of logical AND 410 between CLK_REF 125 and CLK_SHIFT(60°) 220, which has a 60° phase shift relative to the reference clock CLK_REF 125. The resulting duty cycle shown in diagram 570 is approximately 33%.

The output AND(120°) 530 shows the output of logical AND 410 between CLK_REF 125 and CLK_SHIFT(120°) 230, which has a 120° phase shift relative to the reference clock CLK_REF 125. The resulting duty cycle shown in diagram 570 is approximately 17%. The output AND(180°) 540 shows the output of logical AND 410 between CLK_REF 125 and CLK_SHIFT(180°) 240, which has a 180° phase shift relative to the reference clock CLK_REF 125. The resulting duty cycle shown in diagram 570 is approximately 0%. The output AND(240°) 550 shows the output of logical AND 410 between CLK_REF 125 and CLK_SHIFT(240°) 250, which has a 240° phase shift relative to the reference clock CLK_REF 125. The resulting duty cycle shown in diagram 570 is approximately 17%.

The output AND(300°) 560 shows the output of logical AND 410 between CLK_REF 125 and CLK_SHIFT(300°) 260, which has a 300° phase shift relative to the reference clock CLK_REF 125. The resulting duty cycle shown in diagram 570 is approximately 33%. As illustrated in diagram 570, although the duty cycle of output AND_OUT 420 from AND 410 can be used to distinguish between certain phase shifts, it does not generate unique duty cycle values across all phase shifts. For example, the duty cycles of AND(60°) 520 and AND(300°) 560 are both approximately 33%.

Figure 6:
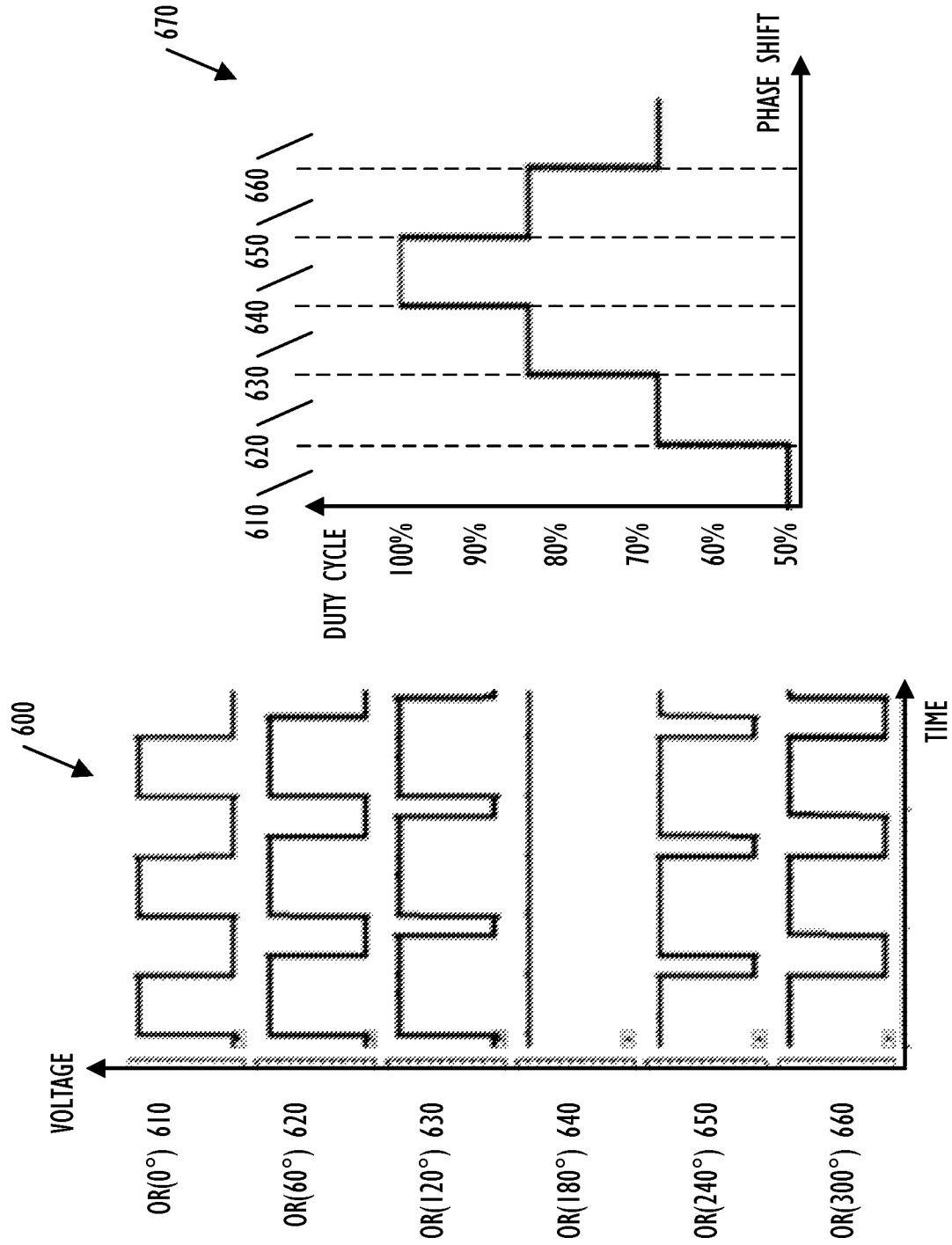
FIG. 6 shows diagrams of the output and corresponding duty cycle of the OR gate in the example simple logic phase-shift to duty-cycle converter shown in FIG. 4 for each of the phase-shifted clock signals shown in FIG. 2 and the corresponding duty cycles, according to an embodiment of the invention.

Returning to the example phase-shift to duty-cycle converter 400 shown in FIG. 4, the OR gate 430 has a first input that receives the reference clock signal CLK_REF 125 and a second input that receives the selected, phase-shifted clock signal CLK_SELECT 145. The OR gate 430 outputs the signal OR_OUT 440, which is logic high in response to either of CLK_REF 125 and CLK_SELECT 145 being logic high and logic low in response to both CLK_REF 125 and CLK_SELECT 145 being logic low. Thus, the output signal OR_OUT 440 has a duty cycle that is dependent on the phase shift between the reference clock signal CLK_REF 125 and the selected, phase-shifted clock signal CLK_SELECT 145 and is discussed further herein with respect to diagrams 600 and 670 shown in FIG. 6.

Diagram 600 shows the resulting OR outputs between the reference clock signal CLK_REF 125 and the phase-shifted clock signals CLK_SHIFT 210-260 shown in FIG. 2 over time. Diagram 670 shows the duty cycle of the OR_OUT 440 across phase shifts. In diagram 600, the output OR(0°) 610 shows the output of logical OR 430 between CLK_REF 125 and CLK_SHIFT(0°) 210, which has a 0° phase shift relative to the reference clock CLK_REF 125. The resulting duty cycle shown in diagram 670 is approximately 50%. In diagram 600, the output OR(60°) 620 shows the output of logical OR 430 between CLK_REF 125 and CLK_SHIFT(60°) 220, which has a 60° phase shift relative to the reference clock CLK_REF 125. The resulting duty cycle shown in diagram 670 is approximately 67%.

The output OR(120°) 630 shows the output of logical OR 430 between CLK_REF 125 and CLK_SHIFT(120°) 230, which has a 120° phase shift relative to the reference clock CLK_REF 125. The resulting duty cycle shown in diagram 670 is approximately 83%. The output OR(180°) 640 shows the output of logical OR 430 between CLK_REF 125 and CLK_SHIFT(180°) 240, which has a 180° phase shift relative to the reference clock CLK_REF 125. The resulting duty cycle shown in diagram 670 is approximately 100%. The output OR(240°) 650 shows the output of logical OR 430 between CLK_REF 125 and CLK_SHIFT(240°) 250, which has a 240° phase shift relative to the reference clock CLK_REF 125. The resulting duty cycle shown in diagram 670 is approximately 83%.

The output OR(300°) 660 shows the output of logical OR 430 between CLK_REF 125 and CLK_SHIFT(300°) 260, which has a 300° phase shift relative to the reference clock CLK_REF 125. The resulting duty cycle shown in diagram 670 is approximately 67%. As illustrated in diagram 670, although the duty cycle of output OR_OUT 440 from OR 430 can be used to distinguish between certain phase shifts, it does not generate unique duty cycle values across all phase shifts. For example, the duty cycles of OR(120°) 630 and OR(240°) 650 are both approximately 83%.

Figure 7:
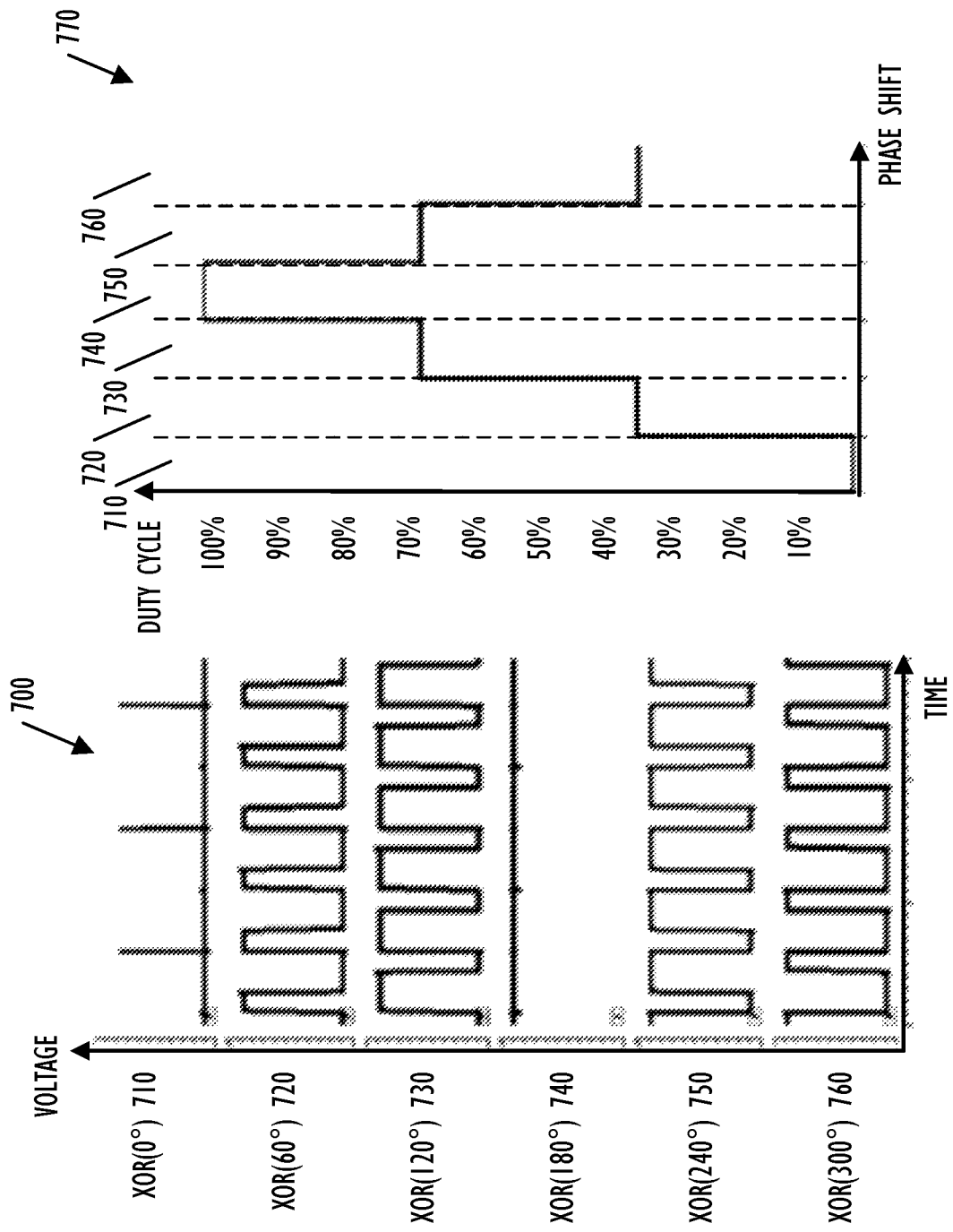
FIG. 7 shows diagrams of the output and corresponding duty cycle of the XOR gate in the example simple logic phase-shift to duty-cycle converter shown in FIG. 4 for each of the phase-shifted clock signals shown in FIG. 2 and the corresponding duty cycles, according to an embodiment of the invention.

Returning to the example phase-shift to duty-cycle converter 400 shown in FIG. 4, the XOR gate 450 has a first input that receives the reference clock signal CLK_REF 125 and a second input that receives the selected, phase-shifted clock signal CLK_SELECT 145. The XOR gate 450 outputs the signal XOR_OUT 460, which is logic high in response to one of CLK_REF 125 and CLK_SELECT 145 being logic high and logic low in response to both of CLK_REF 125 and CLK_SELECT 145 being logic low or logic high. Thus, the output signal XOR_OUT 460 has a duty cycle that is dependent on the phase shift between the reference clock signal CLK_REF 125 and the selected, phase-shifted clock signal CLK_SELECT 145 and is discussed further herein with respect to diagrams 700 and 770 shown in FIG. 7.

Diagram 700 shows the resulting XOR outputs between the reference clock signal CLK_REF 125 and the phase-shifted clock signals CLK_SHIFT 210-260 shown in FIG. 2 over time. Diagram 770 shows the duty cycle of the XOR_OUT 460 across phase shifts. In diagram 700, the output XOR(0°) 710 shows the output of logical XOR 450 between CLK_REF 125 and CLK_SHIFT(0°) 210, which has a 0° phase shift relative to the reference clock CLK_REF 125. The resulting duty cycle shown in diagram 770 is approximately 0%. In diagram 700, the output XOR(60°) 720 shows the output of logical XOR 450 between CLK_REF 125 and CLK_SHIFT(60°) 220, which has a 60° phase shift relative to the reference clock CLK_REF 125. The resulting duty cycle shown in diagram 770 is approximately 33%.

The output XOR(120°) 730 shows the output of logical XOR 450 between CLK_REF 125 and CLK_SHIFT(120°) 230, which has a 120° phase shift relative to the reference clock CLK_REF 125. The resulting duty cycle shown in diagram 770 is approximately 67%. The output XOR(180°) 740 shows the output of logical XOR 450 between CLK_REF 125 and CLK_SHIFT(180°) 240, which has a 180° phase shift relative to the reference clock CLK_REF 125. The resulting duty cycle shown in diagram 770 is approximately 100%. The output XOR(240°) 750 shows the output of logical XOR 450 between CLK_REF 125 and CLK_SHIFT(240°) 250, which has a 240° phase shift relative to the reference clock CLK_REF 125. The resulting duty cycle shown in diagram 770 is approximately 67%.

The output XOR(300°) 760 shows the output of logical XOR 450 between CLK_REF 125 and CLK_SHIFT(300°) 260, which has a 300° phase shift relative to the reference clock CLK_REF 125. The resulting duty cycle shown in diagram 770 is approximately 33%. As illustrated in diagram 770, although the duty cycle of output XOR_OUT 440 from XOR 450 can be used to distinguish between certain phase shifts, it does not generate unique duty cycle values across all phase shifts. For example, the duty cycles of XOR(120°) 730 and XOR(240°) 750 are both approximately 67%.

Figure 8:
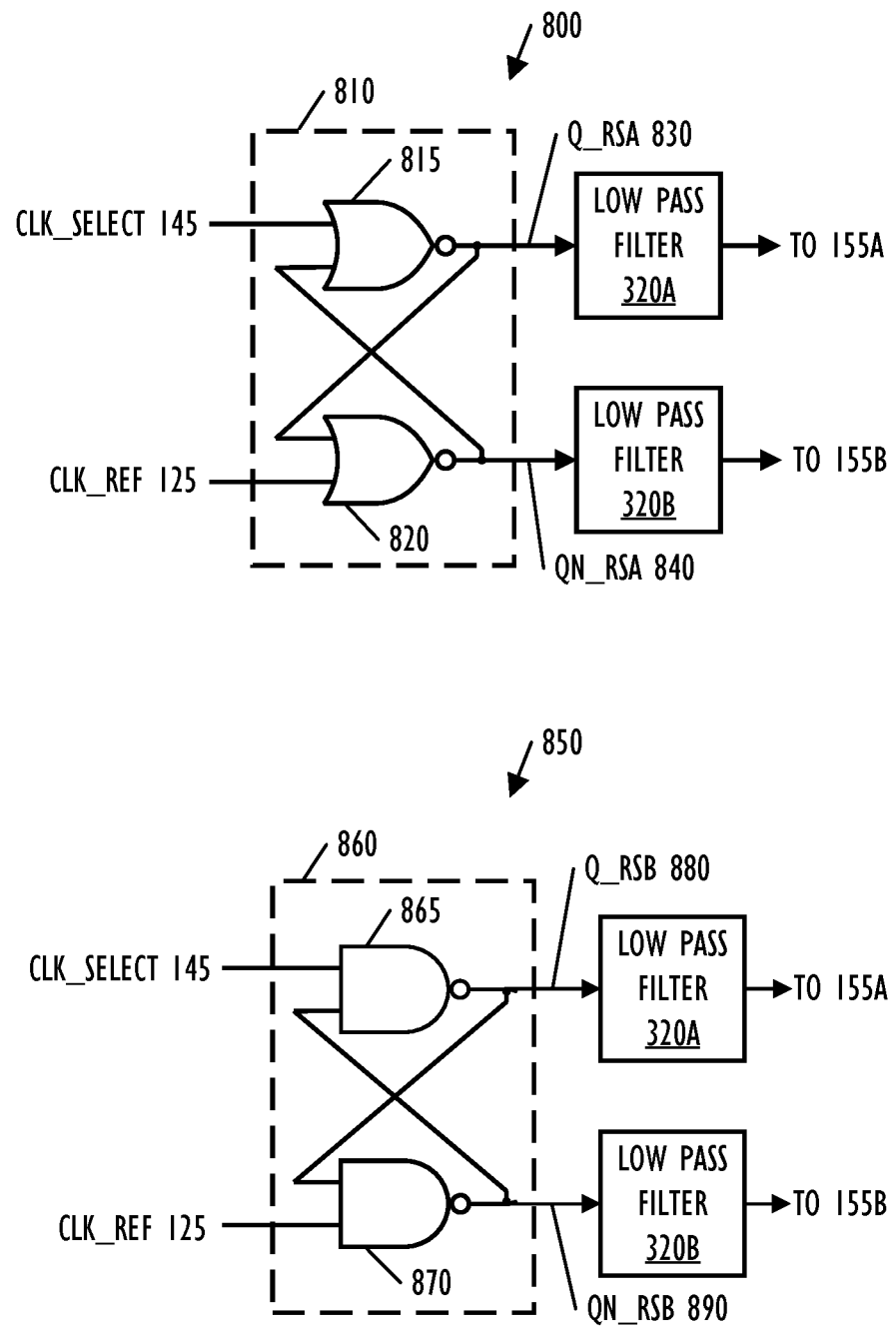
FIG. 8 shows an example reset-set (RS) flip flop implementation of the phase-shift to duty-cycle converter in the example analog test circuit shown in FIG. 3, according to an embodiment of the invention.

In contrast to the simple logic implementation 400 of a phase-shift to duty-cycle converter, FIG. 8 shows example RS flip flop implementations 800 and 850 of the phase-shift to duty-cycle converter in the example analog test circuit shown in FIG. 2, according to an embodiment of the invention. The RS flip flop 810 in implementation 800 includes logical NOR gates, and the RS flip flop 860 in implementation 850 includes logical NAND gates 865 and 870. The logical NOR and NAND gate implementations of RS flip flops are for illustrative purposes only; in other examples, other implementations of the RS flip flop can be used.

The phase-shift to duty-cycle converter 800 includes the NOR gate implementation of the RS flip flop 810 and two low pass filters 320A and 320B. The NOR gate 815 has a first input to receive the selected, phase-shifted clock signal CLK_SELECT 145 and a second input coupled to the output of the second NOR gate 820. The NOR gate 815 generates the output signal Q_RSA 830, which is provided to the low pass filter 320A and to a first input of the second NOR gate 820. The NOR gate 820 has a second input to receive the reference clock signal CLK_REF 125 and generates the output signal QN_RSA 840, which is provided to the low pass filter 320B and to the second input of the NOR gate 815. The output of the low pass filter 320A is provided to the switch 155A, and the output of the low pass filter 320B is provided to the switch 155B.

Figure 9:
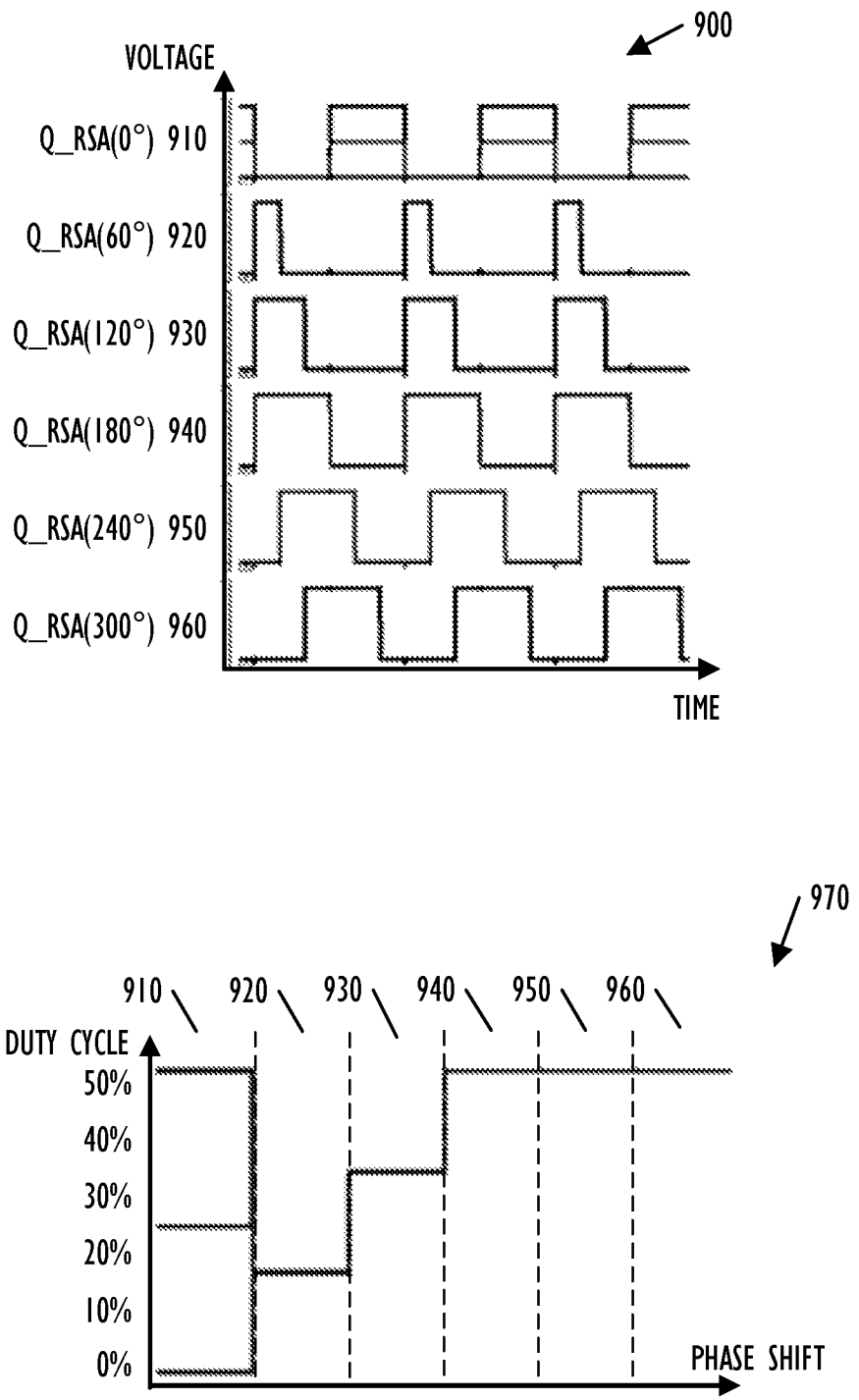
FIG. 9 shows diagrams of a first Q_RSA output and corresponding duty cycle of the first RS flip flop in the RS flip flop phase-shift to duty-cycle converter shown in FIG. 8 for each of the phase-shifted clock signals shown in FIG. 2, according to an embodiment of the invention.
Figure 10:
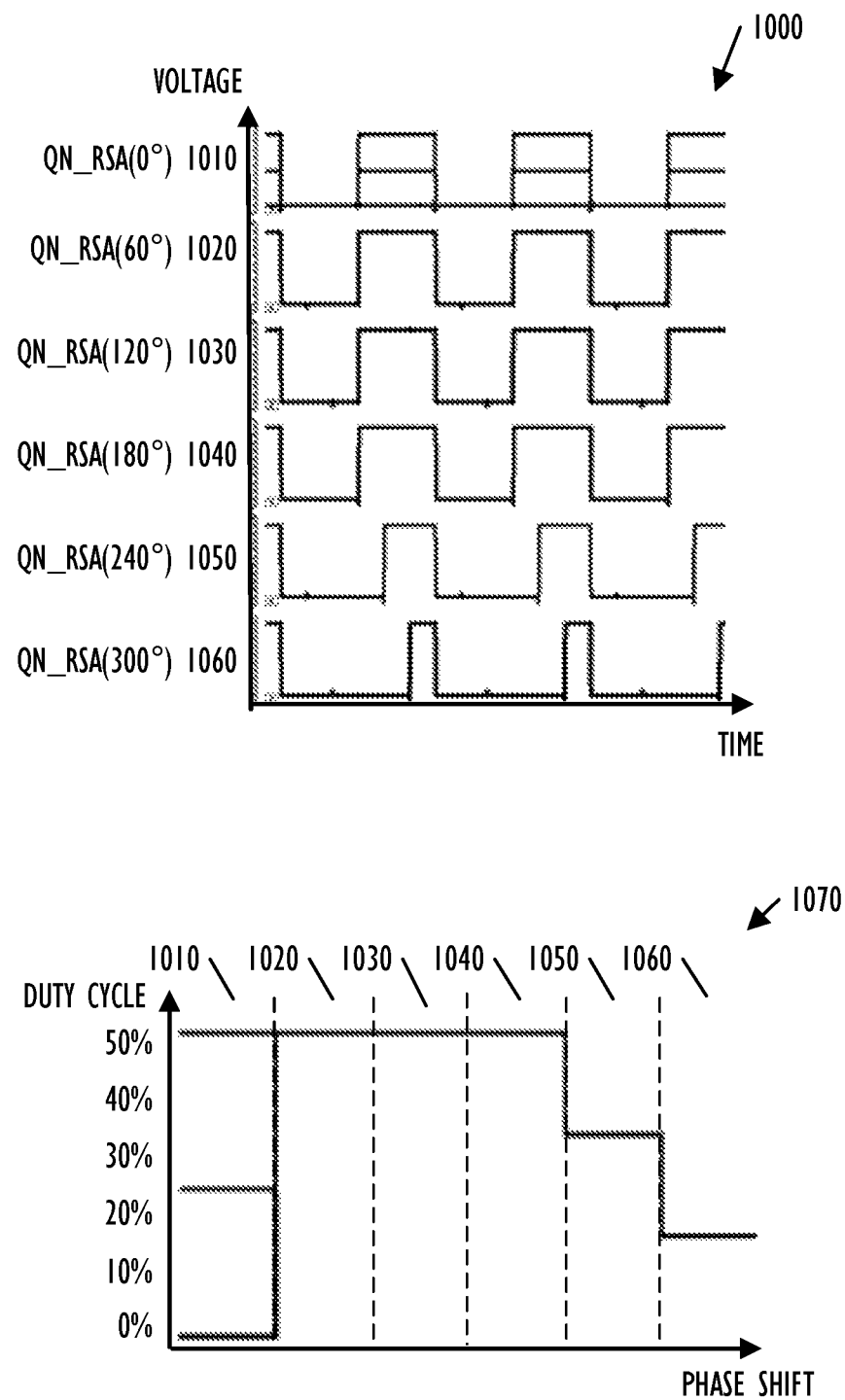
FIG. 10 shows diagrams of a second QN_RSA output and corresponding duty cycle of the first RS flip flop in the RS flip flop phase-shift to duty-cycle converter shown in FIG. 8 for each of the phase-shifted clock signals shown in FIG. 2, according to an embodiment of the invention.

In response to both CLK_SELECT 145 and CLK_REF 125 being logic low, Q_RSA 830 and QN_RSA 840 maintain their previous states. In response to both CLK_SELECT 145 and CLK_REF 125 being logic high, Q_RSA 830 and QN_RSA 840 are logic low. In response to CLK_SELECT 145 being logic low and CLK_REF 125 being logic high, Q_RSA 830 is logic high, and QN_RSA 840 is logic low. In response to CLK_SELECT 145 being logic high and CLK_REF 125 being logic low, Q_RSA 830 is logic low, and QN_RSA 840 is logic high. The diagram 900 in FIG. 9 shows the output Q_RSA 830 for different phase-shifted clock signals CLK_SHIFT 210-260 shown in FIG. 2 over time. Diagram 970 shows the duty cycle of the output Q_RSA 830 across phase shifts. The diagram 1000 in FIG. 10 shows the output QN_RSA 840 for different phase-shifted clock signals CLK_SHIFT 210-260 shown in FIG. 2 over time. Diagram 1070 shows the duty cycle of the output QN_RSA 840 across phase shifts.

In diagram 900, the output Q_RSA(0°) 910 shows the output of logical NOR 815 between CLK_REF 125 and CLK_SHIFT(0°) 210, which has a 0° phase shift relative to the reference clock CLK_REF 125. For a CLK_SELECT 145 such as CLK_SHIFT(0°) 210 that is not phase-shifted relative to CLK_REF 125, the output Q_RSA(0°) 910 varies depending on whether CLK_REF 125 and CLK_SHIFT(0°) 210 are perfectly aligned, slightly delayed relative to each other, or slightly accelerated relative to each other. As a result, the duty cycle shown in diagram 970 and the "logic high" value vary between one of three states: a "high" state with logic high equal to approximately the positive supply voltage and approximately 50% duty cycle in response to the CLK_SHIFT(0°) 210 being slightly accelerated relative to the CLK_REF 125; a "middle" state with logic high equal to approximately half the positive supply voltage and approximately 25% duty cycle in response to the CLK_SHIFT(0°) 210 being aligned with the CLK_REF 125; and a "low" state with logic high equal to approximately ground and approximately 0% duty cycle in response to the CLK_SHIFT(0°) 210 being slightly delayed relative to the CLK_REF 125.

Returning to diagram 900, the output Q_RSA(60°) 920 shows the output of logical NOR 815 between CLK_REF 125 and CLK_SHIFT(60°) 220, which has a 60° phase shift relative to the reference clock CLK_REF 125. The resulting duty cycle shown in diagram 970 is approximately 17%. The output Q_RSA(120°) 930 shows the output of logical NOR 815 between CLK_REF 125 and CLK_SHIFT(120°) 230, which has a 120° phase shift relative to the reference clock CLK_REF 125. The resulting duty cycle shown in diagram 970 is approximately 33%. The output Q_RSA(180°) 940 shows the output of logical NOR 815 between CLK_REF 125 and CLK_SHIFT(180°) 240, which has a 180° phase shift relative to the reference clock CLK_REF 125. The resulting duty cycle shown in diagram 970 is approximately 50%.

The output Q_RSA(240°) 950 shows the output of logical NOR 815 between CLK_REF 125 and CLK_SHIFT(240°) 250, which has a 240° phase shift relative to the reference clock CLK_REF 125. The resulting duty cycle shown in diagram 970 is approximately 50%. The output Q_RSA (300°) 960 shows the output of logical NOR 815 between CLK_REF 125 and CLK_SHIFT(300°) 260, which has a 300° phase shift relative to the reference clock CLK_REF 125. The resulting duty cycle shown in diagram 970 is approximately 50%. As illustrated in diagram 970, although the duty cycle of output Q_RSA 830 from the RS flip flop 810 can be used to distinguish between certain phase shifts, it does not generate unique duty cycle values across all phase shifts. For example, the duty cycles of Q_RSA(180°) 940, Q_RSA(240°) 950, and Q_RSA(300°) 960 are all approximately 50%.

As described previously, the diagram 1000 in FIG. 10 shows the output QN_RSA 840 for different phase-shifted clock signals CLK_SHIFT 210-260 and diagram 1070 shows the duty cycle of the output QN_RSA 840 across phase shifts. In diagram 1000, the output QN_RSA(0°) 1010 shows the output of logical NOR 820 between CLK_REF 125 and CLK_SHIFT(0°) 210, which has a 0° phase shift relative to the reference clock CLK_REF 125. As with Q_RSA(0°) 910, QN_RSA(0°) 1010 varies depending on whether CLK_REF 125 and CLK_SHIFT(0°) 210 are perfectly aligned, slightly delayed relative to each other, or slightly accelerated relative to each other. As a result, the duty cycle shown in diagram 1070 and the logic high value varies between one of three states: a "low" state with logic high equal to approximately ground and approximately 0% duty cycle in response to the CLK_SHIFT(0°) 210 being slightly accelerated relative to the CLK_REF 125; a "middle" state with logic high equal to approximately half the positive supply voltage and approximately 25% duty cycle in response to the CLK_SHIFT(0°) 210 being aligned with the CLK_REF 125; and a "high" state with logic high equal to approximately the positive supply voltage and approximately 50% duty cycle in response to the CLK_SHIFT(0°) 210 being slightly delayed relative to the CLK_REF 125.

Returning to diagram 1000, the output QN_RSA(60°) 1020 shows the output of logical NOR 820 between CLK_REF 125 and CLK_SHIFT(60°) 220, which has a 60° phase shift relative to the reference clock CLK_REF 125. The resulting duty cycle shown in diagram 1070 is approximately 50%. The output QN_RSA(120°) 1030 shows the output of logical NOR 820 between CLK_REF 125 and CLK_SHIFT(120°) 230, which has a 120° phase shift relative to the reference clock CLK_REF 125. The resulting duty cycle shown in diagram 1070 is approximately 50%. The output QN_RSA(180°) 1040 shows the output of logical NOR 820 between CLK_REF 125 and CLK_SHIFT(180°) 240, which has a 180° phase shift relative to the reference clock CLK_REF 125. The resulting duty cycle shown in diagram 1070 is approximately 50%.

The output QN_RSA(240°) 1050 shows the output of logical NOR 820 between CLK_REF 125 and CLK_SHIFT(240°) 250, which has a 240° phase shift relative to the reference clock CLK_REF 125. The resulting duty cycle shown in diagram 1070 is approximately 33%. The output QN_RSA(300°) 1060 shows the output of logical NOR 820 between CLK_REF 125 and CLK_SHIFT(300°) 260, which has a 300° phase shift relative to the reference clock CLK_REF 125. The resulting duty cycle shown in diagram 1070 is approximately 17%. As illustrated in diagram 1070, although the duty cycle of output QN_RSA 840 from the RS flip flop 810 can be used to distinguish between certain phase shifts, it does not generate unique duty cycle values across all phase shifts. For example, the duty cycles of QN_RSA(0°) 1010, QN_RSA(60°) 1020, QN_RSA(120°) 1030, and QN_RSA(180°) 1040 are all approximately 50%.

Returning to FIG. 8, the phase-shift to duty-cycle converter 850 includes the NAND gate implementation of the RS flip flop 860 and two low pass filters 320A and 320B. The NAND gate 865 has a first input to receive the selected, phase-shifted clock signal CLK_SELECT 145 and a second input coupled to the output of the second NAND gate 870. The NAND gate 865 generates the output signal Q_RSB 880, which is provided to the low pass filter 320A and to a first input of the second NAND gate 870. The NAND gate 870 has a second input to receive the reference clock signal CLK_REF 125 and generates the output signal QN_RSB 890, which is provided to the low pass filter 320B and to the second input of the NAND gate 865. The output of the low pass filter 320A is provided to the switch 155A, and the output of the low pass filter 320B is provided to the switch 155B.

Figure 11:
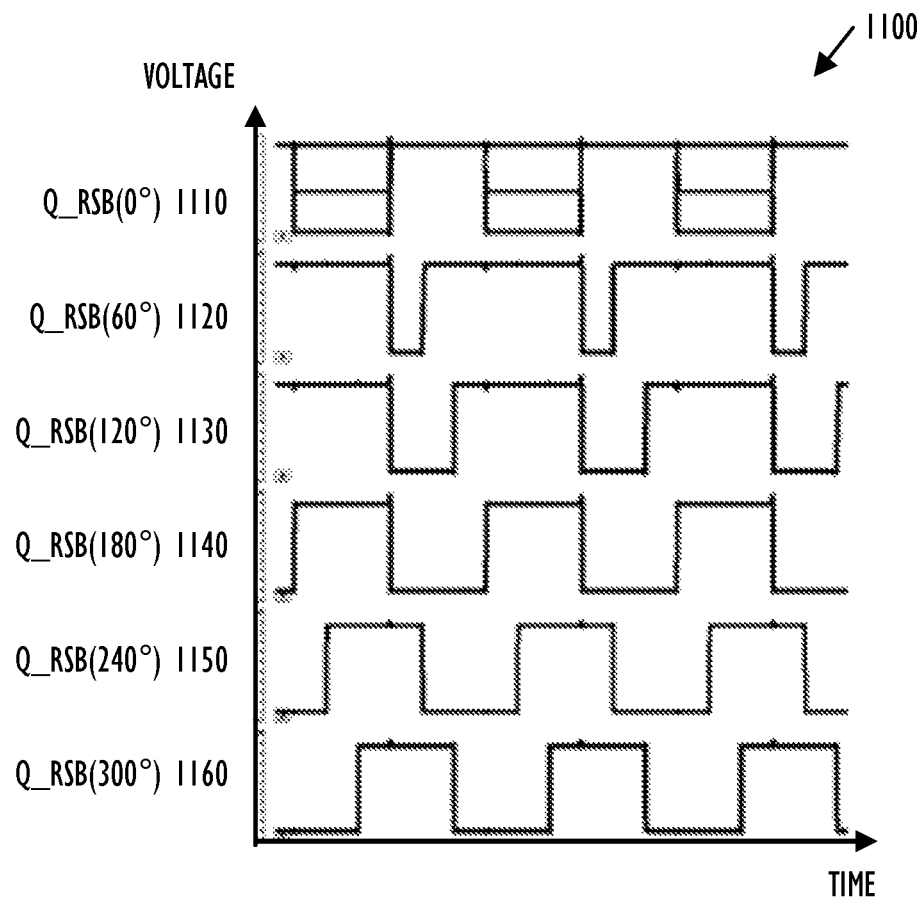
FIG. 11 shows diagrams of a first Q_RSB output and corresponding duty cycle of the second RS flip flop in the RS flip flop phase-shift to duty-cycle converter shown in FIG. 8 for each of the phase-shifted clock signals shown in FIG. 2, according to an embodiment of the invention.
Figure 11:
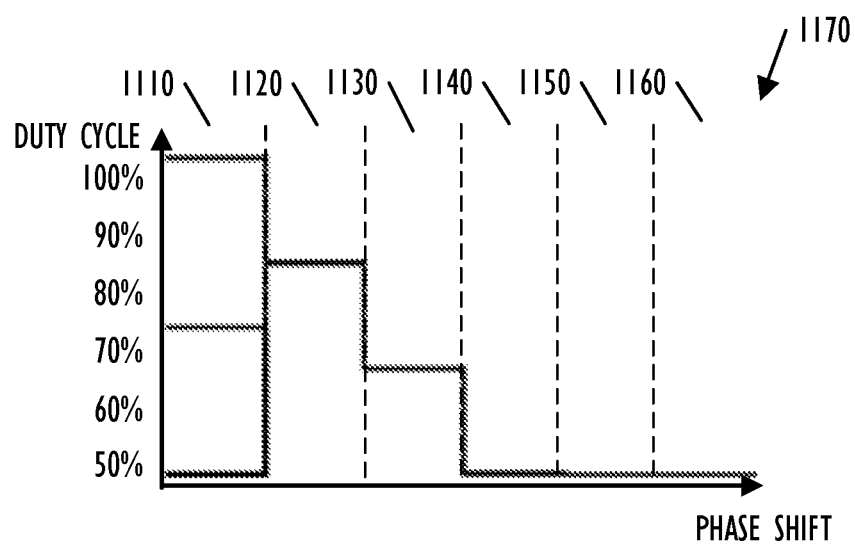
Figure 12:
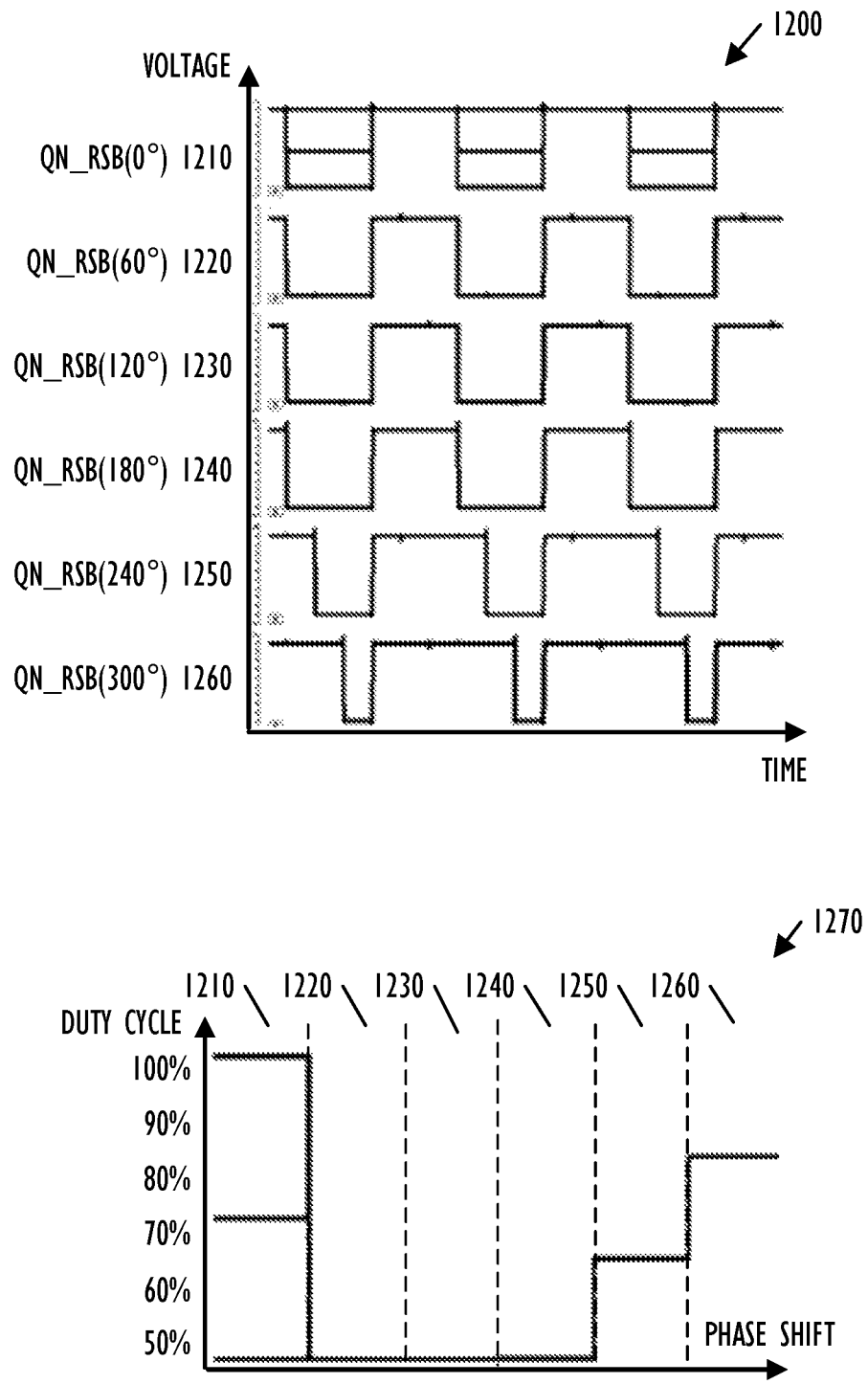
FIG. 12 shows diagrams of a second QN_RSB output and corresponding duty cycle of the second RS flip flop in the RS flip flop phase-shift to duty-cycle converter shown in FIG. 8 for each of the phase-shifted clock signals shown in FIG. 2, according to an embodiment of the invention.

In response to both CLK_SELECT 145 and CLK_REF 125 being logic low, Q_RSB 880 and QN_RSB 890 are logic high. In response to both CLK_SELECT 145 and CLK_REF 125 being logic high, Q_RSA 830 and QN_RSA 840 maintain their previous states. In response to CLK_SELECT 145 being logic low and CLK_REF 125 being logic high, Q_RSB 880 is logic high, and QN_RSB 890 is logic low. In response to CLK_SELECT 145 being logic high and CLK_REF 125 being logic low, Q_RSB 880 is logic low, and QN_RSB 890 is logic high. The diagram 1100 in FIG. 11 shows the output Q_RSB 880 for different phase-shifted clock signals CLK_SHIFT 210-260 shown in FIG. 2 over time. Diagram 1170 shows the duty cycle of the output Q_RSA 830 across phase shifts. The diagram 1200 in FIG. 12 shows the output QN_RSB 890 for different phase-shifted clock signals CLK_SHIFT 210-260 shown in FIG. 2 over time. Diagram 1270 shows the duty cycle of the output QN_RSB 890 across phase shifts.

In diagram 1100, the output Q_RSB(0°) 1110 shows the output of logical NAND 865 between CLK_REF 125 and CLK_SHIFT(0°) 210, which has a 0° phase shift relative to the reference clock CLK_REF 125. For a CLK_SELECT 145 such as CLK_SHIFT(0°) 210 that is not phase-shifted relative to CLK_REF 125, the output Q_RSB(0°) 1110 varies depending on whether CLK_REF 125 and CLK_SHIFT(0°) 210 are perfectly aligned, slightly delayed relative to each other, or slightly accelerated relative to each other. As a result, the duty cycle shown in diagram 1170 and a "logic low" value vary between one of three states: a "low" state with logic low equal to approximately ground and approximately 50% duty cycle in response to the CLK_SHIFT(0°) 210 being slightly accelerated relative to the CLK_REF 125; a "middle" state with logic low equal to approximately half the negative supply voltage and approximately 75% duty cycle in response to the) CLK_SHIFT(0°) 210 being aligned with the CLK_REF 125; and a "high" state with logic low equal to approximately the negative supply voltage and approximately 100% duty cycle in response to the CLK_SHIFT(0°) 210 being slightly delayed relative to the CLK_REF 125.

Returning to diagram 1100, the output Q_RSB(60°) 1120 shows the output of logical NAND 865 between CLK_REF 125 and CLK_SHIFT(60°) 220, which has a 60° phase shift relative to the reference clock CLK_REF 125. The resulting duty cycle shown in diagram 1170 is approximately 83%. The output Q_RSB(120°) 1130 shows the output of logical NAND 865 between CLK_REF 125 and CLK_SHIFT(120°) 230, which has a 120° phase shift relative to the reference clock CLK_REF 125. The resulting duty cycle shown in diagram 1170 is approximately 67%. The output Q_RSB(180°) 1140 shows the output of logical NAND 865 between CLK_REF 125 and CLK_SHIFT(180°) 240, which has a 180° phase shift relative to the reference clock CLK_REF 125. The resulting duty cycle shown in diagram 1170 is approximately 50%.

The output Q_RSB(240°) 1150 shows the output of logical NAND 865 between CLK_REF 125 and CLK_SHIFT(240°) 250, which has a 240° phase shift relative to the reference clock CLK_REF 125. The resulting duty cycle shown in diagram 1170 is approximately 50%. The output Q_RSB(300°) 1160 shows the output of logical NAND 865 between CLK_REF 125 and CLK_SHIFT(300°) 260, which has a 300° phase shift relative to the reference clock CLK_REF 125. The resulting duty cycle shown in diagram 1170 is approximately 50%. As illustrated in diagram 1170, although the duty cycle of output Q_RSB 880 from the RS flip flop 860 can be used to distinguish between certain phase shifts, it does not generate unique duty cycle values across all phase shifts. For example, the duty cycles of Q_RSB(180°) 1140, Q_RSB(240°) 1150, and Q_RSB(300°) 1160 are all approximately 50%.

As described previously, the diagram 1200 in FIG. 12 shows the output QN_RSB 890 for different phase-shifted clock signals CLK_SHIFT 210-260 and diagram 1270 shows the duty cycle of the output QN_RSB 890 across phase shifts. In diagram 1200, the output QN_RSB(0°) 1210 shows the output of logical NAND 870 between CLK_REF 125 and CLK_SHIFT(0°) 210, which has a 0° phase shift relative to the reference clock CLK_REF 125. As with Q_RSB(0°) 1110, QN_RSB(0°) 1210 varies depending on whether CLK_REF 125 and CLK_SHIFT(0°) 210 are perfectly aligned, slightly delayed relative to each other, or slightly accelerated relative to each other. As a result, the duty cycle shown in diagram 1270 and the logic low value vary between one of three states: a "high" state with logic low equal to approximately the negative supply voltage and approximately 100% duty cycle in response to the CLK_SHIFT(0°) 210 being slightly accelerated relative to the CLK_REF 125; a "middle" state with logic low equal to approximately half the negative supply voltage and approximately 75% duty cycle in response to the CLK_SHIFT(0°) 210 being aligned with the CLK_REF 125; and a "low" state with logic low equal to approximately ground level and approximately 50% duty cycle in response to the CLK_SHIFT(0°) 210 being slightly delayed relative to the CLK_REF 125.

Returning to diagram 1200, the output QN_RSB(60°) 1220 shows the output of logical NAND 870 between CLK_REF 125 and CLK_SHIFT(60°) 220, which has a 60° phase shift relative to the reference clock CLK_REF 125. The resulting duty cycle shown in diagram 1270 is approximately 50%. The output QN_RSB(120°) 1230 shows the output of logical NAND 870 between CLK_REF 125 and CLK_SHIFT(120°) 230, which has a 120° phase shift relative to the reference clock CLK_REF 125. The resulting duty cycle shown in diagram 1270 is approximately 50%. The output QN_RSB(180°) 1240 shows the output of logical NAND 870 between CLK_REF 125 and CLK_SHIFT (180°) 240, which has a 180° phase shift relative to the reference clock CLK_REF 125. The resulting duty cycle shown in diagram 1270 is approximately 50%.

The output QN_RSB(240°) 1250 shows the output of logical NAND 870 between CLK_REF 125 and CLK_SHIFT(240°) 250, which has a 240° phase shift relative to the reference clock CLK_REF 125. The resulting duty cycle shown in diagram 1270 is approximately 67%. The output QN_RSB(300°) 1260 shows the output of logical NAND 870 between CLK_REF 125 and CLK_SHIFT(300°) 260, which has a 300° phase shift relative to the reference clock CLK_REF 125. The resulting duty cycle shown in diagram 1270 is approximately 83%. As illustrated in diagram 1270, although the duty cycle of output QN_RSB 890 from the RS flip flop 860 can be used to distinguish between certain phase shifts, it does not generate unique duty cycle values across all phase shifts. For example, the duty cycles of QN_RSB(0°) 1210, QN_RSB(60°) 1220, QN_RSB(120°) 1230, and QN_RSB(180°) 1240 are all approximately 50%.

Figure 13:
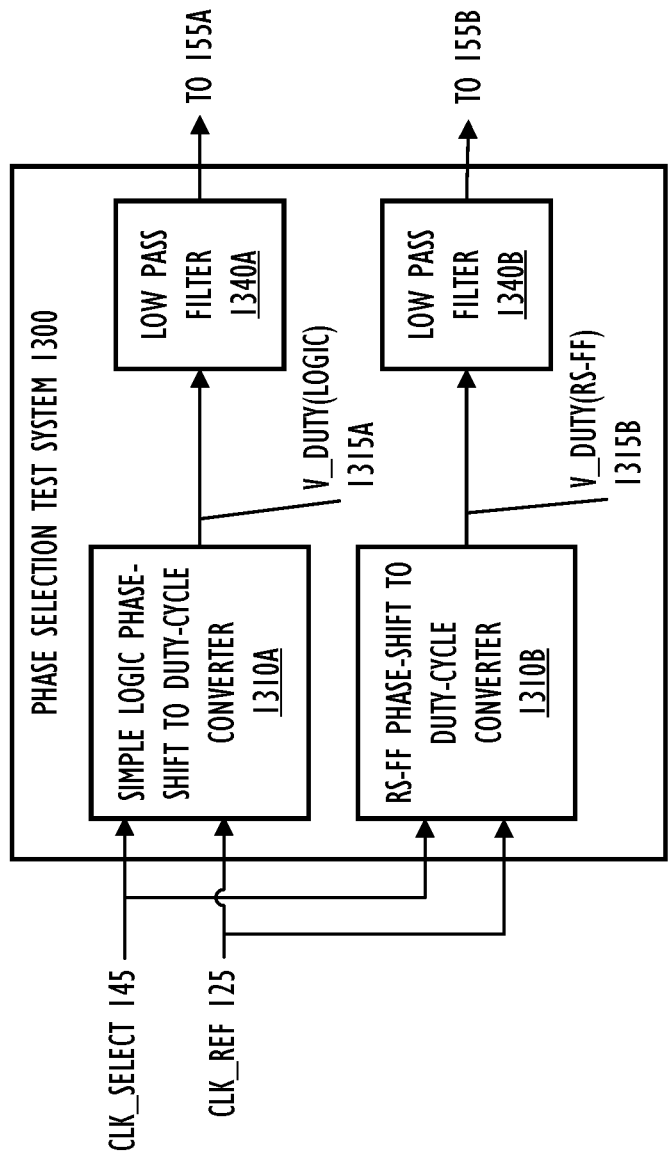
FIG. 13 shows, in block diagram form, an example analog test circuit including two phase-shift to duty-cycle converters and corresponding low pass filters, according to an embodiment of the invention.

Thus, the NOR gate implementation of RS flip flop 810 and the NAND gate implementation of RS flip flop 860 introduce ambiguity into the phase-shift to duty-cycle conversion. Similarly, the simple logic implementation 400 of the phase-shift to duty-cycle converter also experiences ambiguity for certain phase shifts. However, the combination of an RS flip flop and a simple logic gate can resolve the ambiguity across phase shifts. FIG. 13 shows, in block diagram form, an example analog phase selection test system 1300 including two phase-shift to duty-cycle converters 1310A and 1310B, according to an embodiment of the invention. For ease of illustration, the phase selection test circuit 1300 is described herein with respect to the phase-shifted clock generation and selection system 100 shown in FIG. 1. The simple logic phase-shift to duty-cycle converter 1310A is a simple logic implementation, and the RS-FF phase-shift to duty-cycle converter 1310B is a RS flip flop implementation.

The simple logic phase-shift to duty-cycle converter 1310A can be any appropriate simple logic gate, and may include a single or multiple simple logic gates that are the same or different from each other. Similarly, the RS-FF phase-shift to duty-cycle converter 1310B can be any appropriate RS flip flop implementation and may include simple logic gates that are the same or different from the simple logic gate used in the simple logic phase-shift to duty-cycle converter 1310A. Whatever the particular implementations of the simple logic phase-shift to duty-cycle converter 1310A, the known range of phase shifts over which the RS flip flop phase-shift to duty-cycle converter 1310B is ambiguous can be used by the self-test controller 180 to resolve ambiguities in the phase shifts over which the duty cycle of the simple logic phase-shift to duty-cycle converter 1310A is ambiguous.

For example, the simple logic phase-shift to duty-cycle converter 1310A includes an OR logic gate, and the RS flip flop phase-shift to duty-cycle converter 1310B includes the NOR logic gate implementation 810 shown in FIG. 8. As illustrated in diagram 970 of FIG. 9, the output Q_RSA 830 from the RS flip flop 810 does not generate unique duty cycle values for CLK_SHIFT(180°) 240, CLK_SHIFT (240°) 250, and CLK_SHIFT(300°) 260. Similarly, as illustrated in diagram 670 of FIG. 6, the output OR_OUT 440 from the OR gate 430 does not generate unique duty cycle values for the pair CLK_SHIFT(60°) 220 and CLK_SHIFT (300°) 260 and the pair CLK_SHIFT(120°) 230 and CLK_SHIFT(240°) 250.

While the output Q_RSA 830 has an ambiguous 50% duty cycle for CLK_SHIFT(180°) 240, CLK_SHIFT(240°) 250, or CLK_SHIFT(300°) 260, the ambiguous output OR_OUT 430 for the pair CLK_SHIFT(60°) 220 and CLK_SHIFT (300°) 260 and the pair CLK_SHIFT(120°) 230 and CLK_SHIFT(240°) 250 can be resolved in favor of CLK_SHIFT (300°) 260 and CLK_SHIFT(240°) 250, respectively. Similarly, while the output Q_RSA 830 does not have an ambiguous duty cycle for CLK_SHIFT(60°) 220 and CLK_SHIFT (120°) 230, the ambiguous output OR_OUT 430 for the pair) CLK_SHIFT(60°) 220 and CLK_SHIFT(300°) 260 and the pair CLK_SHIFT(120°) 230 and CLK_SHIFT(240°) 250 can be resolved in favor of CLK_SHIFT(60°) 220 and CLK_SHIFT(120°) 230, respectively.

Figure 14:
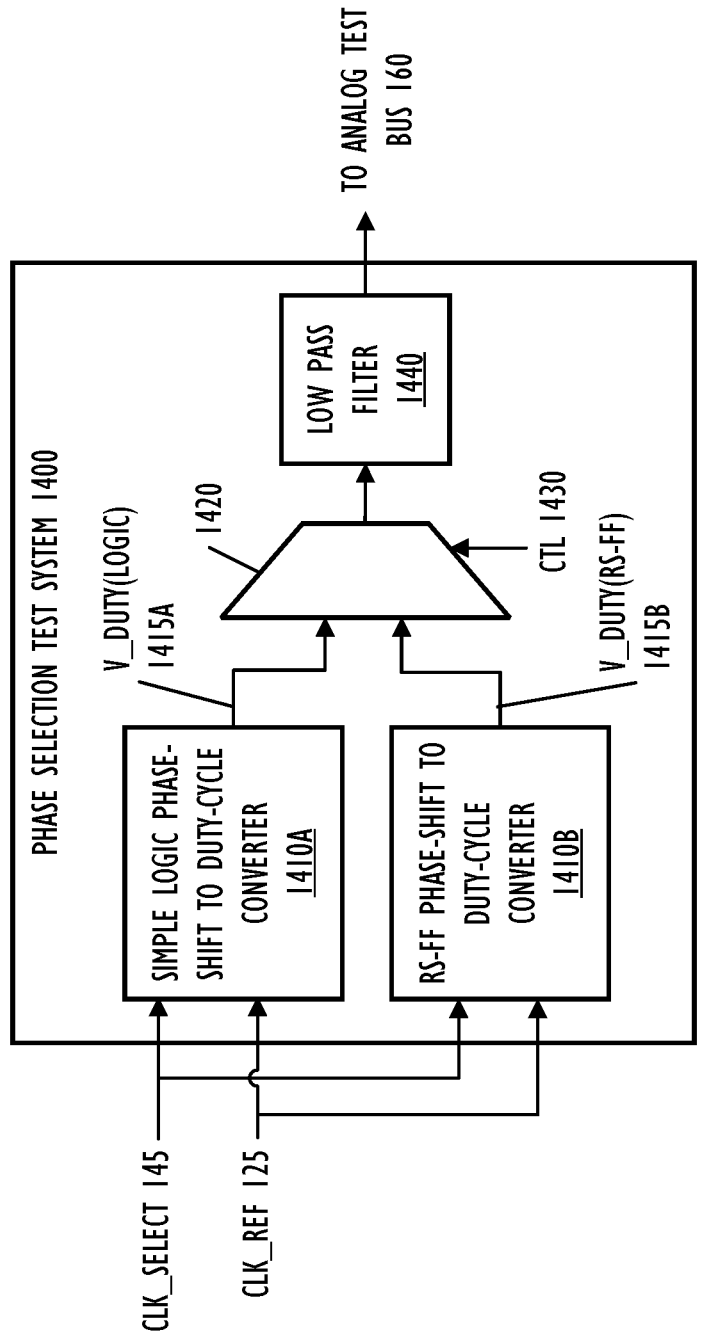
FIG. 14 shows, in block diagram form, an example analog test circuit including time-multiplexed phase-shift to duty-cycle converters, according to an embodiment of the invention.

The phase selection test system 1300 enables simultaneous measurement of both the output V_DUTY(LOGIC) 1315A from the simple logic phase-shift to duty-cycle converter 1310A and the output V_DUTY(RS-FF) 1315B from the RS flip flop phase-shift to duty-cycle converter 13106, according to an embodiment of the invention. The output V_DUTY(LOGIC) 1315A is provided to the low pass filter 1340A, which averages the duty cycle of V_DUTY (LOGIC) 1315A and provides it to the switch 155A in the switch set 150 shown in FIG. 1. The output V_DUTY(RS-FF) 1315B is provided to the low pass filter 1340B, which averages the duty cycle of V_DUTY(RS-FF) 1315B and provides to the switch 155B in the switch set 150. Although both V_DUTY(LOGIC) 1315A and V_DUTY(RS-FF) 1315B can be measured simultaneously, the second low pass filter 13408 increases the area of the integrated circuit occupied by the phase selection test system 1300 relative to the area of the integrated circuit occupied by the phase selection test system 1400 shown in FIG. 14.

In the phase selection test system 1400, the output V_DUTY(LOGIC) 1415A from the simple logic phase-shift to duty-cycle converter 1410A and the output V_DUTY(RS-FF) 1415B from the RS flip flop phase-shift to duty-cycle converter 1410B are provided to inputs of the selector logic circuit 1420, which is a multiplexor in this example but may be any appropriate selector logic circuit. The multiplexor 1420 outputs one of the output V_DUTY(LOGIC) 1415A and the output V_DUTY(RS-FF) 14158 based on the control signal CTL 1430, which may be provided to the multiplexor 1420 by the self-test controller 180 or the like discussed herein with respect to FIG. 1. The output of the multiplexor 1420 is provided to a single low pass filter 1440, which averages the duty cycle and provides an equivalent voltage to the analog test bus 160. Time multiplexing the output V_DUTY(LOGIC) 1415A and the output V_DUTY(RS-FF) 14158 saves the area of a second low pass filter, although the time multiplexing prevents measuring both V_DUTY (LOGIC) 1415A and V_DUTY(RS-FF) 14158 simultaneously.

As described herein, the disclosed phase-shift to duty-cycle converters can be used to convert a phase difference between high frequency clock signals into a low frequency signal within the bandwidths of the switches and analog test bus as well as the sampling rate of the ADC. The low frequency signal generated by the disclosed phase-shift to duty-cycle converter can be measured on-chip without the need for transmission lines to carry high frequency signals off-chip, avoiding the corresponding interference to the operation of other circuits on the integrated circuit. In addition, the low frequency signal generated by the disclosed phase-shift to duty-cycle converter can be measured by standard components already incorporated in the integrated circuit without requiring extra-wide bandwidths in the switches and analog test bust or extra-high sampling rates in the ADC. In some implementations, the combination of a simple logic phase-shift to duty-cycle converter and an RS flip flop phase-shift to duty-cycle converter can be used to resolve ambiguities in the duty cycle of each for particular phase differences.

Features specifically shown or described with respect to one embodiment set forth herein may be implemented in other embodiments set forth herein.

In this description, the term "couple" may cover connections, communications, or signal paths that enable a functional relationship consistent with this description, including intermediate or intervening components that do not alter the functional relationship. A device that is "configured to" perform a task or function may be configured by programming or hardwiring, for example, at a time of manufacturing by a manufacturer and/or may be configurable or reconfigurable by a user after manufacturing. The configuring may be done through firmware and/or software, construction and/or layout of hardware components and connections, or any combination thereof. As used herein, "node", "pin", and "lead" are used interchangeably. A circuit or device described herein as including certain components may be adapted to be coupled to those components instead, to form the described circuitry or device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

A phase selection test system includes a phase-shift to duty-cycle converter and a low pass filter. The phase-shift to duty-cycle converter has a first input to receive a reference clock and a second input to receive a phase-shifted clock that is phase-shifted relative to the reference clock. The low pass filter has an input coupled to an output of the phase-shift to duty-cycle converter and an output to provide an output signal. In some implementations, the phase-shift to duty-cycle converter includes a simple logic gate that has the first input and the second input. In some implementations, the phase-shift to duty-cycle converter includes a reset-set flip flop that has the first input and the second input.

In some implementations, the phase-shift to duty-cycle converter includes a simple logic gate and a reset-set flip flop. The simple logic gate has a third input coupled to the first input and a fourth input coupled to the second input. The reset-set flip flop has a fifth input coupled to the first input and a sixth input coupled to the second input. The output of the phase-shift to duty-cycle converter is at least one of the output of the simple logic gate and the output of the reset-set flip flop.

In some implementations, a selector logic circuit is coupled between the phase-shift to duty-cycle converter and the low pass filter. The selector logic circuit has a first input coupled to the output of the simple logic gate, a second input coupled to the output of the reset-set flip flop, and a third input configured to receive a control signal. The output of the selector logic circuit is coupled to the low pass filter. The selector logic circuit provides one of the output of the simple logic gate and the output of the reset-set flip flop to the output of the selector logic circuit based on the control signal.

In some implementations, the low pass filter is a first low pass filter and the output signal from the first low pass filter is a first output signal. The input of the first low pass filter is coupled to the output of the simple logic gate. The phase selection test system also includes a second low pass filter that has an input coupled to the output of the reset-set flip flop and an output to provide a second output signal. In some implementations, the output of the simple logic gate is ambiguous for a first particular set of phase shifts between the phase-shifted clock and the reference clock, and the output of the reset-set flip flop is ambiguous for a second particular set of phase shifts between the phase-shifted clock and the reference clock. The first and second particular sets of phase shifts resolve the ambiguities in the output of the simple logic gate and the output of the reset-set flip flop.

A device includes a simple logic gate, a reset-set flip flop, and a low pass filter. The simple logic gate has a first input to receive a reference clock and a second input to receive a phase-shifted clock. The simple logic gate generates a simple logic output signal having a duty cycle dependent on a phase difference between the reference clock and the phase-shifted clock. The duty cycle of the simple logic output signal is unique for a first set of phase differences and ambiguous for a second set of phase differences. The reset-set flip flop has a third input to receive the reference clock and a fourth input to receive the phase-shifted clock. The reset-set flip flop generates a flip flop output signal having a duty cycle dependent on the phase difference between the reference clock and the phase-shifted clock. The duty cycle of the flip flop output signal is unique for a third set of phase differences and ambiguous for a fourth set of phase differences. The low pass filter has input to receive at least one of the simple logic output signal and the flip flop output signal and generates an averaged output signal based on the at least one of the simple logic output signal and the flip flop output signal.

In some implementations, the device also includes a selector logic circuit that has a first input to receive the simple logic output signal, a second input to receive the flip flop output signal, and a third input to receive a control signal. The selector logic circuit outputs the at least one of the simple logic output signal and the flip flop output signal to the input of the low pass filter based on the control signal. In some implementations, the low pass filter is a first low pass filter and has an input to receive the simple logic output signal. The first low pass filter generates a first averaged output signal based on the simple logic output signal. The device also includes a second low pass filter that has an input to receive the flip flop output signal and generates a second averaged output signal based on the flip flop output signal.

In some implementations, the device includes an analog test bus and a self-test controller. The analog test bus is coupled to an output of the low pass filter, and the self-test controller is coupled to the analog test bus. The self-test controller determines the phase difference between the reference clock and the phase-shifted clock based on the averaged output signal from the low pass filter. In some implementations, the self-test controller resolves the ambiguous duty cycle of the simple logic output signal for the second set of phase differences based on the duty cycle of the flip flop output signal and the ambiguous duty cycle of the flip flop output signal for the fourth set of phase differences based on the duty cycle of the simple logic output signal. In some implementations, the device also includes an analog-to-digital converter coupled between the analog test bus and the self-test controller.

In some implementations including the self-test controller, the device includes a selector logic circuit that has a first input to receive the simple logic output signal, a second input to receive the flip flop output signal, and a third input to receive a control signal provided by the self-test controller. The selector logic circuit outputs the at least one of the simple logic output signal and the flip flop output signal based on the control signal.

An apparatus includes a simple logic gate, a reset-set flip flop, and a filtering circuit. The simple logic gate has a first input to receive a reference clock, a second input to receive a phase-shifted clock that is phase-shifted relative to the reference clock, and a first output. The reset-set flip flop has a third input to receive the reference clock, a fourth input to receive the phase-shifted clock, and a second output. The filtering circuit has a fifth input coupled to at least one of the first and second outputs. In some implementations, the apparatus also includes a selector logic circuit coupled between the outputs of the simple logic gate and the reset-set flip flop and the input of the filtering circuit. The selector logic circuit has a sixth input coupled to the first output, a seventh input coupled to the second output, and an eighth input to receive a control signal. The selector logic circuit has a third output coupled to the fifth input.

In some implementations, the apparatus also includes an analog test bus and a self-test controller. The analog test bus is coupled to an output of the filtering circuit, and the self-test controller is coupled to the analog test bus. The self-test controller is configured to determine a phase-difference between the reference clock and the phase-shifted clock based on a signal output from the filtering circuit. In some implementations including the self-test controller and the selector logic circuit, the self-test controller is configured to generate the control signal for the selector logic circuit.

In some implementations, the filtering circuit is a first filtering circuit, and the fifth input is coupled to the first output. The apparatus also includes a second filtering circuit having a sixth input coupled to the second output. In some implementations including the second filtering circuit, the apparatus also includes an analog test bus and a self-test controller. The analog test bus is coupled to outputs of the first and second filtering circuits, and the self-test controller is coupled to the analog test bus. The self-test controller is configured to determine a phase difference between the reference clock and the phase-shifted clock based on a first signal output from the first filtering circuit and a second signal output from the second filtering circuit.

What is claimed is:

1. A phase selection test system, comprising:
   a phase-shift to duty-cycle converter having a first input to receive a reference clock, a second input to receive a phase-shifted clock, and an output, wherein the phase-shifted clock is phase-shifted relative to the reference clock, the phase-shift to duty-cycle converter generates a converter output signal at the output having a first duty cycle that is dependent on a phase difference between the reference clock and the phase-shifted clock and that is unique for a first set of phase differences and ambiguous for a second set of phase differences;
   a reset-set flip flop including a third input to receive the reference clock, a fourth input to receive the phase-shifted clock, and a flip flop output to provide a flip flop output signal having a second duty cycle dependent on the phase difference between the reference clock and the phase-shifted clock; and
   a low pass filter having an input coupled to at least one of the output of the phase-shift to duty-cycle converter and the flip flop output and including a filter output to provide an output signal that is based on at least one of the converter output signal and the flip flop output signal.

2. The phase selection test system of claim 1, wherein the phase-shift to duty-cycle converter comprises a simple logic gate having the first input to receive the reference clock and the second input to receive the phase-shifted clock.

3. The phase selection test system of claim 2, further comprising a selector logic circuit coupled between the phase-shift to duty-cycle converter and the low pass filter, the selector logic circuit having:
   a first input configured to receive an output of the simple logic gate;
   a second input configured to receive an output of the reset-set flip flop;
   a third input configured to receive a control signal; and
   an output coupled to the input of the low pass filter, wherein the selector logic circuit is configured to provide one of the converter output signal of the simple logic gate and the flip flop output signal of the reset-set flip flop to the output of the selector logic circuit based on the control signal.

4. The phase selection test system of claim 2, wherein:
the low pass filter is a first low pass filter;
the output signal is a first output signal;
an input of the first low pass filter is coupled to the output of the simple logic gate; and
the phase selection test system further comprises a second low pass filter having an input coupled to the flip flop output of the reset-set flip flop and an output to provide a second output signal.

5. The phase selection test system of claim 1, wherein the flip flop output signal has the second duty cycle that is unique for a third set of phase differences and ambiguous for a fourth set of phase differences between the reference clock and the phase-shifted clock.

6. A device, comprising:
a simple logic gate having a first input to receive a reference clock and a second input to receive a phase-shifted clock, wherein the simple logic gate generates a simple logic output signal having a duty cycle dependent on a phase difference between the reference clock and the phase-shifted clock, wherein the duty cycle of the simple logic output signal is unique for a first set of phase differences and ambiguous for a second set of phase differences;
a reset-set flip flop having a third input to receive the reference clock and a fourth input to receive the phase-shifted clock, wherein the reset-set flip flop generates a flip flop output signal having a duty cycle dependent on the phase difference between the reference clock and the phase-shifted clock, wherein the duty cycle of the flip flop output signal is unique for a third set of phase differences and ambiguous for a fourth set of phase differences; and
a low pass filter having an input to receive at least one of the simple logic output signal and the flip flop output signal, wherein the low pass filter generates an averaged output signal based on the at least one of the simple logic output signal and the flip flop output signal.

7. The device of claim 6, further comprising a selector logic circuit having a first input to receive the simple logic output signal, a second input to receive the flip flop output signal, and a third input to receive a control signal, wherein the selector logic circuit outputs the at least one of the simple logic output signal and the flip flop output signal based on the control signal.

8. The device of claim 6, wherein the low pass filter is a first low pass filter having the input to receive the simple logic output signal and generates a first averaged output signal based on the simple logic output signal, the device further comprising a second low pass filter having an input to receive the flip flop output signal and generates a second averaged output signal based on the flip flop output signal.

9. The device of claim 6, further comprising:
an analog test bus coupled to an output of the low pass filter; and
a self-test controller coupled to the analog test bus and configured to determine the phase difference between the reference clock and the phase-shifted clock based on the averaged output signal from the low pass filter.

10. The device of claim 9, wherein the self-test controller is configured to resolve the ambiguous duty cycle of the simple logic output signal for the second set of phase differences based on the duty cycle of the flip flop output signal and the ambiguous duty cycle of the flip flop output signal for the fourth set of phase differences based on the duty cycle of the simple logic output signal.

11. The device of claim 9, further comprising an analog-to-digital converter coupled between the analog test bus and the self-test controller.

12. The device of claim 9, further comprising a selector logic circuit having a first input to receive the simple logic output signal, a second input to receive the flip flop output signal, and a third input to receive a control signal, wherein the selector logic circuit outputs the at least one of the simple logic output signal and the flip flop output signal based on the control signal, and wherein the self-test controller is further configured to generate the control signal.

13. An apparatus, comprising:
a simple logic gate having a first input configured to receive a reference clock and a second input configured to receive a phase-shifted clock, the simple logic gate further having a first output, wherein the phase-shifted clock is phase-shifted relative to the reference clock;
a reset-set flip flop having a third input configured to receive the reference clock and a fourth input configured to receive the phase-shifted clock, the reset-set flip flop having a second output;
a filtering circuit having a fifth input coupled to at least one of the first and second outputs; and
a selector logic circuit coupled between the first and second outputs and the fifth input, the selector logic circuit having a sixth input coupled to the first output, a seventh input coupled to the second output, and an eighth input configured to receive a control signal, the selector logic circuit further having a third output coupled to the fifth input.

14. The apparatus of claim 13, further comprising:
an analog test bus coupled to an output of the filtering circuit; and
a self-test controller coupled to the analog test bus and configured to determine a phase difference between the reference clock and the phase-shifted clock based on a signal output from the filtering circuit.

15. The apparatus of claim 14, wherein the self-test controller is further configured to generate the control signal for the selector logic circuit.

16. The apparatus of claim 13, wherein the filtering circuit is a first filtering circuit, wherein the fifth input is coupled to the first output, the apparatus further comprising a second filtering circuit having a sixth input coupled to the second output.

17. The apparatus of claim 16, further comprising:
an analog test bus coupled to an output of the first filtering circuit and an output of the second filtering circuit; and
a self-test controller coupled to the analog test bus and configured to determine a phase difference between the reference clock and the phase-shifted clock based on a first signal output from the first filtering circuit and a second signal output from the second filtering circuit.

* * * * *